April 13, 1965 M. N. GLICKMAN 3,178,621

SEALED HOUSING FOR ELECTRONIC ELEMENTS

Filed May 1, 1962

INVENTOR.
Mannes N. Glickman

BY Philip S. Hilbert

ATTORNEY

United States Patent Office 3,178,621
Patented Apr. 13, 1965

3,178,621
SEALED HOUSING FOR ELECTRONIC ELEMENTS

Mannes N. Glickman, Hollywood, Calif.
(4232 Temple City Blvd., Rosemead, Calif.)
Filed May 1, 1962, Ser. No. 191,579
2 Claims. (Cl. 317—234)

This invention relates to sealed electronic elements, and more particularly, concerns transistors, diodes, photocells or the like in combination with housings for sealing the same.

When mounting transistor or diode elements in metal holders having vitreous seals, it has been found that the elements are welded or otherwise secured to the terminals of the holder at temperatures which may impair the vitreous seal, causing immediate or future failure of the seal.

Accordingly, an object of this invention is to provide an improved combination of electronic component and a housing therefor, wherein the seal is of a character which will not give rise to adverse effects when the assembly is completed.

Another object of this invention is to provide a nonmetallic housing for electronic components including transistors, diodes, photocells, or the like, together with an improved non-vitreous seal.

Still another object of this invention is to provide improved seals for electronic components which can be made economically and in a rapid manner.

Other objects of this invention will in part be obvious and in part hereinafter pointed out.

Figure 1:
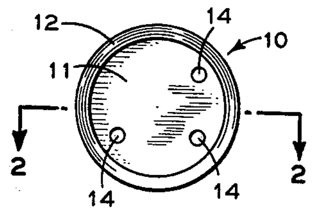
FIG. 1 is a top plan view of a housing forming a part of the invention herein.

Referring in detail to the drawing, and particularly to FIGS. 1–5 and 7; 10 designates a cupped ceramic member forming a housing portion of the sealed assembly embodying the invention. The member 10 is of cylindrical shape with a bottom wall 11 and an upstanding rim 12, forming a recess 13. The bottom wall 11 is formed with spaced through openings 14.

Figure 3:
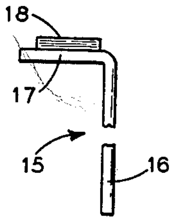
FIG. 3 is a side elevational view of a terminal member and an associated electronic component.
Figure 4:
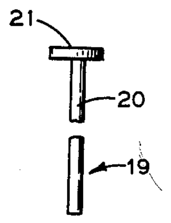
FIG. 4 is a side elevational view of another terminal member.

A plurality of elongated metal terminal members are provided for mounting in openings 14 of member 10. As shown in FIG. 3, one terminal member 15 includes a shank portion 16 and a flattened head portion 17 at the upper end of shank portion 16. A transistor element 18 in wafer or slide form is securely welded to head portion 17 to establish an electrical connection between the usual base electrode portion of the transistor element and terminal member 15. Other terminal members 19 are provided, each comprising shank portions 20 and head portions 21.

The transistor element 18 having been prewelded to terminal member 15; the assembly is disposed with the shank portion extending through an opening 14 in member 10; the head portion 17 spanning the opening and resting on wall 11. The remaining terminal members 19 are disposed with their shank portions 20 in the respective openings 14 of member 10 and their head portions resting on bottom wall 11 thereof.

Figure 5:
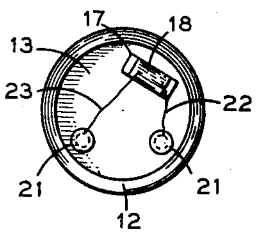
FIG. 5 is a top plan view of showing the electronic component in place within the housing.
Figure 2:
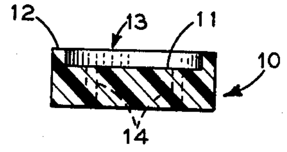
FIG. 2 is a side elevational view thereof.

The remaining electrical connections between transistor element 18 and terminal members 19 are now made by welding whisker wires 22, 23 at one end thereof to the head portions of the terminal members, and at the other end thereof to the usual emitter and collector electrode portions of the element 18, as shown in FIG. 5. The assembly, thus prepared, is ready for sealing.

To this end, a small quantity of epoxy resin 25 is applied over the exposed transistor element 18; the resin adhering to the rim of the member 10 and also filling the openings 14 in bottom wall 11. Thus, transistor element 18 and terminal members 15, 19 are sealed in place, see FIG. 7. It has been found that the epoxy resin is highly effective as a hermetic seal and will withstand temperatures of up to about 250° C., after the assembly has been baked at temperatures sufficient to cure the applied epoxy resin.

Figure 6:
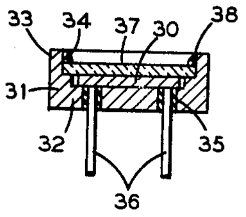
FIG. 6 is a sectional view showing a complete assembly of housing a photocell.
Figure 7:
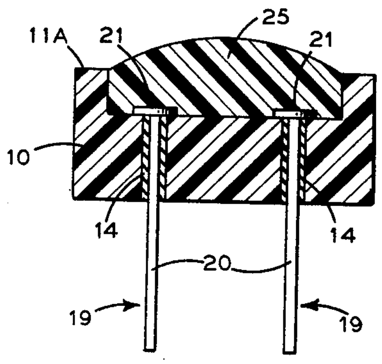
FIG. 7 is a vertical sectional view showing the completed assembly of housing and electronic component sealed therein.

As shown in FIG. 6, a photocell element 30 may be sealed in a ceramic holder 31. Holder 31 is in cupped form, having a bottom wall 32, a rim 33; the rim having a circular recess 34. The bottom wall 32 of holder 31 is formed with through openings as at 35 to pass terminal members 36. The upper ends of terminal members 36 are secured, by suitable electrically conductive cement, to the element 30.

Epoxy resin is used to seal terminal members 36 in openings 35. A window element 37 is mounted in recess 34 of rim 33 and is secured in place by a suitable cement as at 38; the cement being an epoxy resin. The holder 31 may be evacuated, if desired, before the seals are applied.

As various changes might be made in the embodiments of the invention herein disclosed without departing from the spirit thereof, it is understood that all matter herein shown or described shall be deemed illustrative and not limiting except as set forth in the appended claims.

What is claimed is:

1. A holder for electronic components comprising a ceramic member having a wall portion formed with spaced openings, an elongated terminal member in each of said openings and extending to opposite sides of said wall portion, each of said terminal members having a flattened head portion on the inner end thereof, said electronic component being secured to the flattened head portion of at least one of said terminal members and in electrically conductive relation thereto, and a synthetic resin dielectric body fusibly sealed to peripheral portions of said ceramic member and embedding said electronic component and integral portions of said resin dielectric body sealing said terminal members in said openings.

2. A hermetically sealed transistor comprising a cupped ceramic holder having a bottom wall formed with spaced through openings and an upstanding rim, an elongated terminal member in each of said openings, each terminal member having a flattened head portion at the inner end thereof, a transistor element welded to the flattened head portion of one of said terminal members, electrical connector means interconnecting the head portions of the other terminal members with portions of said transistor element, and an epoxy resin seal in adherent relation to the rim of said holder and embedding said transistor element, said resin seal including integral portions thereof sealing the terminal members in the respective openings in the bottom wall of said holder.

References Cited by the Examiner

UNITED STATES PATENTS

| | | | |
|---|---|---|---|
| 1,723,579 | 8/29 | Ruben | 317—234 |
| 2,114,591 | 4/38 | Clark | 136—89 |
| 2,178,969 | 11/39 | Ruben | 317—234 |
| 2,181,494 | 11/39 | Nix | 136—89.01 |
| 2,711,464 | 6/55 | Anderson et al. | 136—89 |
| 2,773,158 | 12/56 | Myers | 317—234 |
| 2,804,581 | 8/57 | Lichtgarn. | |
| 2,853,662 | 9/58 | Woods | 317—234 |
| 2,930,904 | 3/60 | Fritts | 317—234 |
| 2,971,138 | 2/61 | Meisel et al. | 317—234 |

DAVID J. GALVIN, *Primary Examiner.*

JAMES D. KALLAM, GEORGE N. WESTBY, *Examiners.*